(12) United States Patent
Cunanan et al.

(10) Patent No.: US 9,461,379 B2
(45) Date of Patent: Oct. 4, 2016

(54) CHARGER AND METHOD FOR CHARGING A BATTERY PACK

(71) Applicant: Black & Decker Inc., Newark, DE (US)

(72) Inventors: Regina G. C. Cunanan, Parkville, MD (US); Brian K. Wohltmann, Shrewsbury, PA (US); Dustin Lee, Abingdon, MD (US)

(73) Assignee: Black & Decker Inc., New Britain, CT (US)

( * ) Notice: Subject to any disclaimer, the term of this patent is extended or adjusted under 35 U.S.C. 154(b) by 246 days.

(21) Appl. No.: 14/452,145

(22) Filed: Aug. 5, 2014

(65) Prior Publication Data

US 2014/0340053 A1  Nov. 20, 2014

Related U.S. Application Data

(62) Division of application No. 13/080,887, filed on Apr. 6, 2011, now Pat. No. 8,796,995.

(60) Provisional application No. 61/321,699, filed on Apr. 7, 2010.

(51) Int. Cl.
| | |
|---|---|
| *H01M 10/44* | (2006.01) |
| *H01R 12/70* | (2011.01) |
| *B25F 5/02* | (2006.01) |
| *H02J 7/00* | (2006.01) |
| *H02J 7/04* | (2006.01) |
| *H02P 7/29* | (2016.01) |
| *H01M 10/48* | (2006.01) |
| *H05B 33/08* | (2006.01) |

(Continued)

(52) U.S. Cl.
CPC ........... *H01R 12/7005* (2013.01); *B25F 5/021* (2013.01); *G01R 31/3627* (2013.01); *H01M 10/441* (2013.01); *H01M 10/482* (2013.01); *H01R 13/112* (2013.01); *H02J 7/0003* (2013.01); *H02J 7/007* (2013.01); *H02J 7/0008* (2013.01); *H02J 7/0019* (2013.01); *H02J 7/0021* (2013.01); *H02J 7/0031* (2013.01); *H02J 7/0047* (2013.01); *H02J 7/0063* (2013.01); *H02J 7/045* (2013.01); *H02P 3/08* (2013.01); *H02P 7/285* (2013.01); *H02P 7/29* (2013.01); *H05B 33/0806* (2013.01); *G01R 31/362* (2013.01); *G01R 31/3682* (2013.01); *H01H 9/061* (2013.01); *H01M 2010/4271* (2013.01); *H01M 2010/4278* (2013.01); *H01M 2220/30* (2013.01); *H02J 2007/004* (2013.01); *H02J 2007/0067* (2013.01); *H02P 31/00* (2013.01)

(58) Field of Classification Search
CPC .... H02J 7/0008; H02J 7/0013; H02J 7/0021; H02J 7/0047; H02J 7/007
USPC ........ 320/107, 116, 128, 137, 138; 324/427, 324/433
See application file for complete search history.

(56) References Cited

U.S. PATENT DOCUMENTS

| | | | |
|---|---|---|---|
| 2009/0234598 A1* | 9/2009 | Angquist | H01M 10/39 324/427 |
| 2014/0159666 A1* | 6/2014 | Takeyama | H02J 7/0013 320/126 |

*Primary Examiner* — Edward Tso
(74) *Attorney, Agent, or Firm* — Michael Aronoff

(57) ABSTRACT

A charger and a method for charging a battery pack having a plurality of battery cells is presented. The method includes measuring the voltage of the battery cell(s), comparing the voltage measurement(s) of the cell(s) to a target charge voltage value and if the voltage measurement(s) of the cell(s) is not greater than or equal to the target charge voltage value than setting a current for the battery pack based on the voltage measurement(s) of the cell(s).

7 Claims, 8 Drawing Sheets

(51) Int. Cl.
  *H02P 3/08* (2006.01)
  *H02P 7/285* (2016.01)
  *H01R 13/11* (2006.01)
  *H01H 9/06* (2006.01)
  *H01M 10/42* (2006.01)
  *G01R 31/36* (2006.01)
  *H02P 31/00* (2006.01)

CHARGER AND METHOD FOR CHARGING A BATTERY PACK

CROSS-REFERENCE TO RELATED APPLICATIONS

This application is a divisional of U.S. Nonprovisional application Ser. No. 13/080,887 filed on Apr. 6, 2011 which claims the benefit of U.S. Provisional Application No. 61/321,699 filed on Apr. 7, 2010. The disclosure of the above application is incorporated herein by reference.

FIELD

The present disclosure relates to an improved charger and method for charging a battery pack.

BACKGROUND

Cordless products or devices which use rechargeable batteries are prevalent in the marketplace. Rechargeable batteries may be used in numerous devices ranging from computers to power tools. Since the devices use a plurality of battery cells, the battery cells are commonly packaged in a battery pack. The battery pack may in turn be used to power the devices when coupled thereto. Once depleted, the battery pack may be recharged by a battery charger.

Battery chargers typically use a single light emitting diode (LED) to simply indicate to the user that the battery is charging correctly. Battery chargers typically do not indicate what the current state of charge is for the battery. Consequently, the user is left guessing as to the current state of charge of the battery pack as well as how much longer until charging is complete. In some instances, battery chargers may provide an indication of the current state of charge of a battery. These instances rely upon multiple LEDs or other complex user interfaces which significantly increase the total cost of the product. Therefore, it is desirable to provide a simple and cost effective manner for indicating the current state of charge of a battery being charged by a battery charger.

The statements in this section merely provide background information related to the present disclosure and may not constitute prior art.

SUMMARY

In one aspect of the disclosure, a method is provided for indicating state of charge of a battery being charged by a charger. The method includes: delivering a charging current from a battery charger to a battery pack; determining voltage of one or more battery cells residing in the battery pack; and illuminating a visual indicator on the battery charger to indicate the state of charge of the battery pack, where brightness of the visual indicator correlates to the voltage of the battery cells in the battery pack.

In another aspect of the disclosure, an improved method is provided for charging a battery pack coupled to a battery charger. The method includes: determining voltage of one or more battery cells in the battery pack; selecting a magnitude for a charge current from amongst two or more different charge currents based on the voltage of the battery cells when the voltage of the battery cells is below a target charge value; and delivering the selected charge current to the battery cells.

In yet another aspect of the disclosure, a method is provided for determining if contamination is present at an interface between a battery pack coupled to a battery charger. The method includes: measuring an unloaded voltage across two terminals of a battery pack; delivering a current from the charger via the terminals to the battery pack; measuring a loaded voltage across the terminal of the battery pack while delivering the current to the battery pack; determining a difference between the loaded voltage and the unloaded voltage; and comparing the difference to an expected voltage drop across the battery cells of the battery pack, thereby determining if contamination is present at the interface between the battery pack and the battery charger. The operator may be notified to clean the terminals of the battery pack when the difference exceeds the expected voltage drop.

Further areas of applicability will become apparent from the description provided herein. It should be understood that the description and specific examples are intended for purposes of illustration only and are not intended to limit the scope of the present disclosure.

DRAWINGS

FIG. 1 is a diagram of an exemplary system of power tools;

FIG. 2 a block diagram of an exemplary configuration for a battery charger that operably couples to different types of battery packs;

Figure 1:
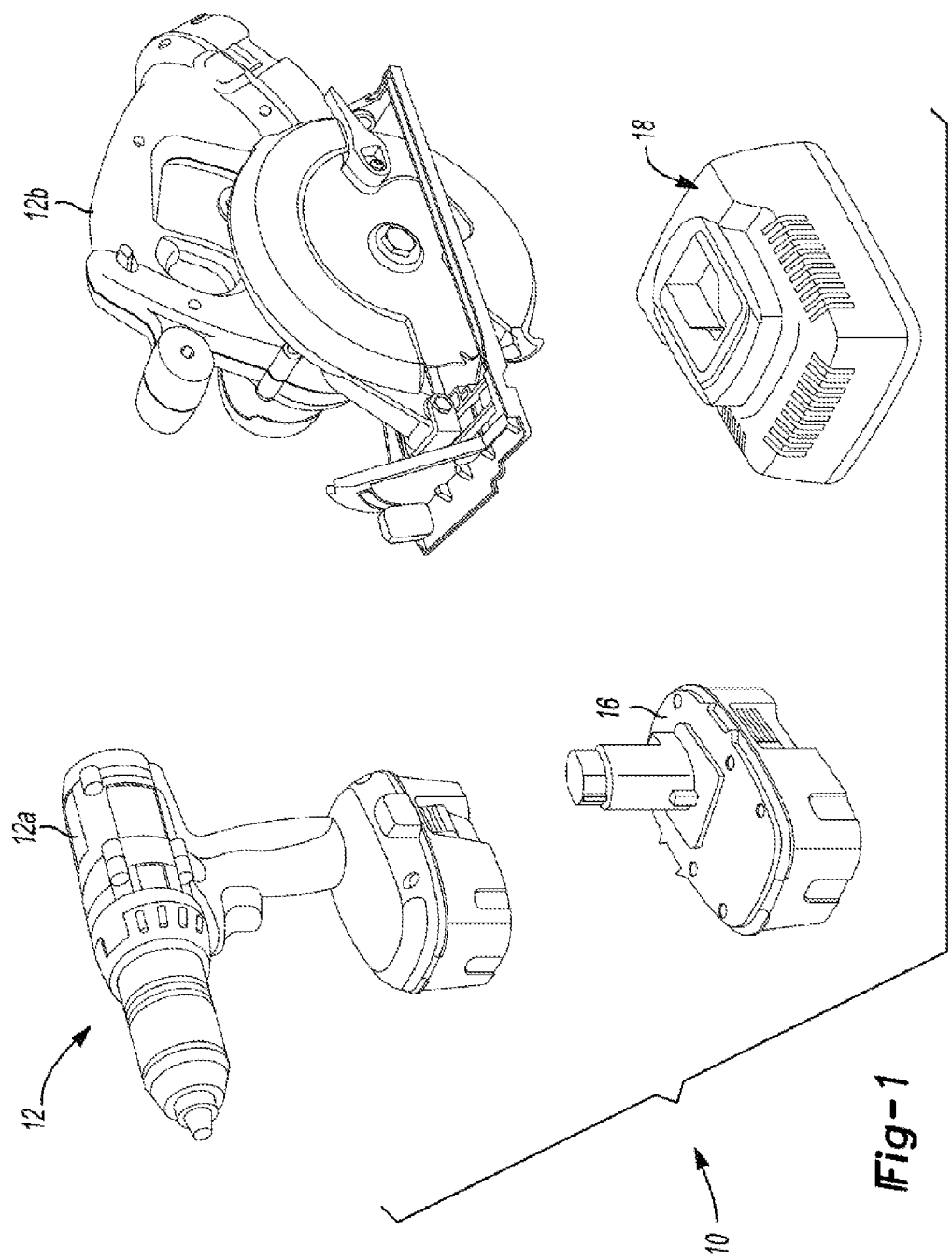

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

The present disclosure can relate to a system of power tools of the type that is generally indicated by reference numeral 10 in FIG. 1. The system of power tools 10 can include, for example, one or more power tools 12, one or more battery packs 16 and a battery pack charger 18. Each of the power tools 12 can be any type of power tool, including without limitation drills, drill/drivers, hammer drill/drivers, rotary hammers, screwdrivers, impact drivers, circular saws, jig saws, reciprocating saws, band saws, cut-off tools, cut-out tools, shears, sanders, vacuums, lights, routers, adhesive dispensers, concrete vibrators, lasers, staplers and nailers. In the particular example provided, the system of power tools 10 includes a first power tool 12a and a second power tool 12b. For example, the first power tool 12a can be a drill/driver similar to that which is described in U.S. Pat. No. 6,431,289, while the second power tool 12b can be a circular saw similar to that which is described in U.S. Pat. No. 6,996,909. A battery pack 16 can be selectively coupled to either of the first and second power tools 12a and 12b to provide electrical power thereto. It is noteworthy that the broader aspects of this disclosure are applicable to other types of battery powered devices.

Figure 2:
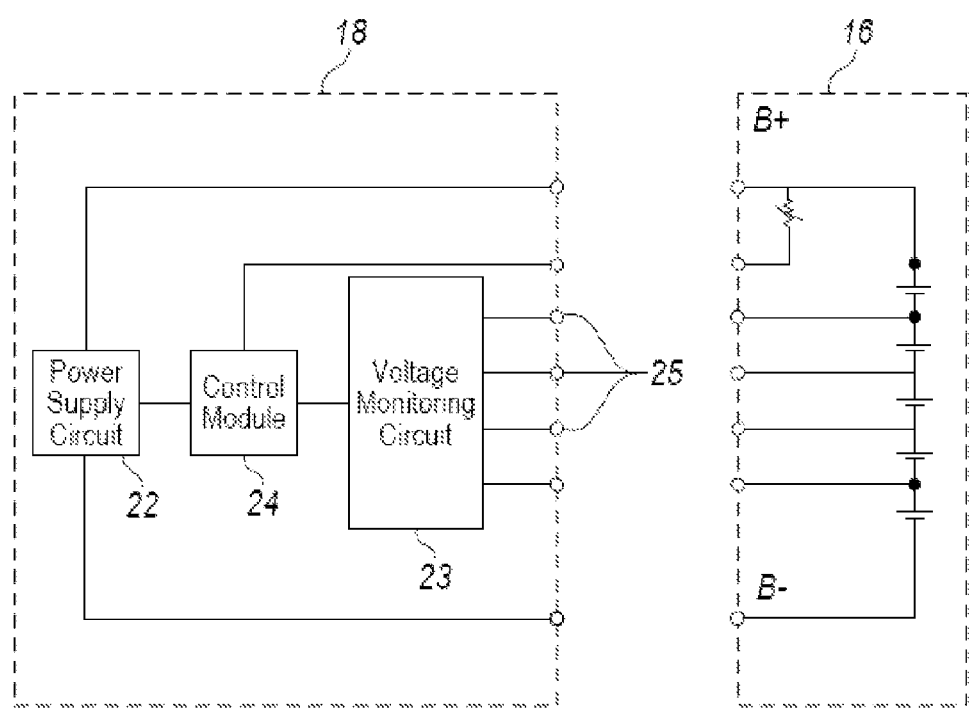

FIG. 2 illustrates an exemplary configuration of a battery charger 18 that operably couples to a battery pack 16. The battery charger 18 is generally comprised of a power supply circuit 22 (i.e., current source), a voltage monitoring circuit 23 and a charger control module 24. The exemplary configurations are merely provided as a context for describing the concepts disclosed herein. Moreover, the configuration may represent only a portion of the internal circuitry. The battery pack and/or the battery charger may include additional functionality or components such as identification components, protection circuits and/or other internal components which are not shown herein for reasons for clarity.

The charger control module 24 is responsible for charging the battery cells and monitoring any fault conditions which may develop during charging. In an exemplary embodiment, the charger control module 24 is implemented as software (processor-executable instructions) on a digital microcontroller. However, the charger control module 24 may be embodied in hardware or software as a digital microcontroller, a microprocessor or an analog circuit, a digital signal processor or by one or more digital ICs such as application specific integrated circuits (ASICs), for example.

To charge a battery pack 16, the pack 16 is operably coupled to the battery charger 18. Various techniques for detecting the presence of the battery pack may be employed. Upon detecting the battery pack 16, the battery charger 18 initiates a charging scheme. In an exemplary charging scheme, the charger 18 delivers a constant current to the battery pack 16. When the stack voltage, an individual cell or a portion of the cells reaches a target charging value, the charger 18 switches from a constant current mode to a constant voltage mode. The charger 18 continues charging in constant voltage mode until the charge current drops below a predefined threshold (e.g., 100 mA) at which time the charge current is terminated.

Figure 3:
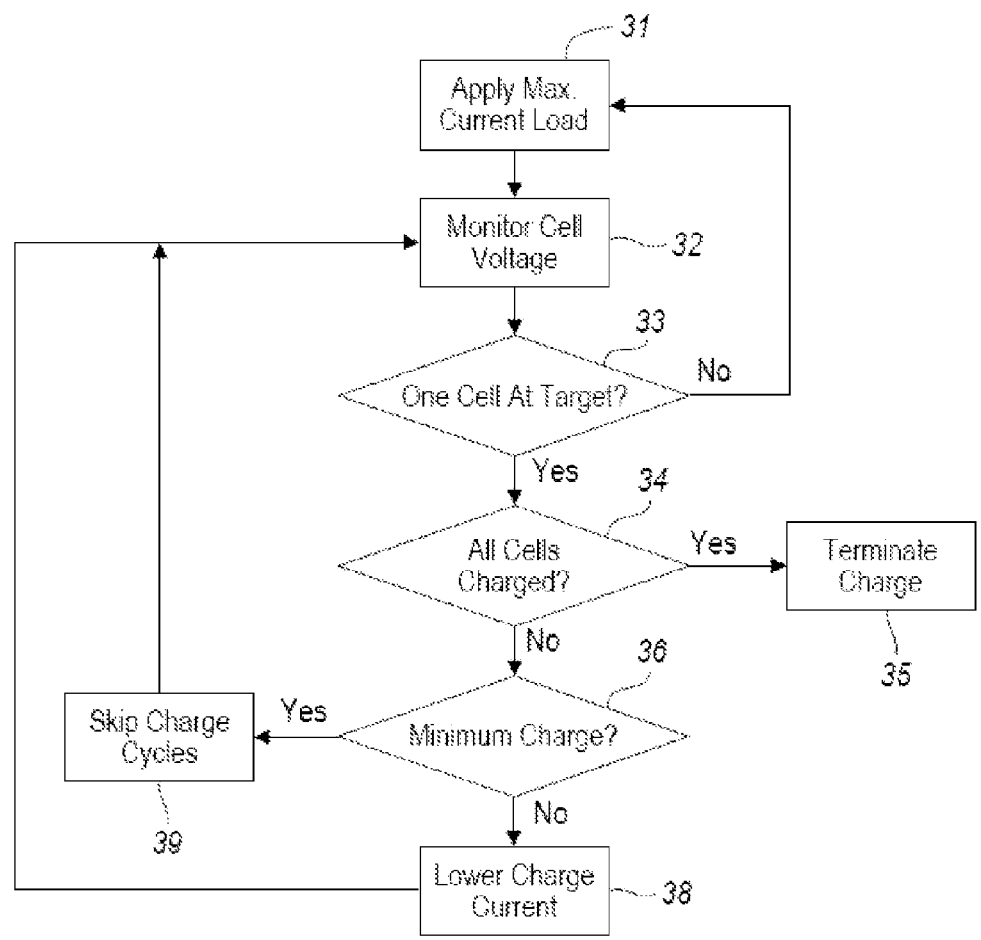
FIG. 3 is a flowchart illustrating an exemplary charging scheme according the present disclosure.

FIG. 3 illustrates another exemplary charging scheme which may be implemented by the charger control module 24 of the charger 18. In this scheme, the battery charger 18 begins by delivering a charge current 31 to the battery pack. The charge current may be set at a maximum value which can be delivered by the charger (e.g., 3 amps) or some lesser value. In some embodiments, the charge current may be delivered in periodic charge cycles (e.g., cycles of one second duration); whereas, in other embodiments, the charge current is delivered in continuously.

Cell voltages are continually being monitored at step 32 via the voltage monitoring circuit 23 during the charging process. In the exemplary embodiment, the cell voltage measurements can be made between charge cycles by the voltage monitoring circuit 23. The voltage monitoring circuit 23 is preferably configured to take individual cell measurements in a sequential manner during a span, e.g., of about 10-70 milliseconds, in a manner further described below. Individual cell measurements are in turn reported to the charger control module 24 for further assessment. In the case that the charge current is delivered continuously, cell voltage measurements are taken while the charge current is being delivered to the battery cells.

The maximum charge current will continue to be delivered to the battery pack until at least one of the battery cells reaches a target charging value (e.g., 4.15 volts) as indicated at step 33. When one or more of the battery cells reaches the target charging value, the charge current will be lowered. In an exemplary embodiment, the charge current is lowered in predefined increments at step 38 until it reaches a minimum charge current (e.g., 200 mA) that can be output by the charger. For example, the charge current may be reduced in half although other decrements are also contemplated.

The average charge current delivered to the battery cells may be lowered further by skipping charge cycles. When the charger is outputting a minimum charge current and less than all of the cells have reached the target charge value, charge cycles are skipped at step 39 to further lower the average charge current delivered to the cells. For example, skipping every other charge cycle further reduces the average charging current being delivered by the charger by 50% (e.g., from 200 mA to an average of 100 mA).

After each charge cycle, cell measurements are taken and a determination is made as to whether to lower the charge current. In the exemplary embodiment, the determination to lower the charge current is made by the charger control module 24. In response to this command, the charger control module 24 interfaces with the power supply circuit 22 to lower the charge current being delivered by the charger. When all of the battery cells have reached the target charge value, the charge current is terminated as indicated at step 35. This charging scheme is particularly suitable for battery packs having cell balancing functionality. Other types of charging schemes are contemplated within the broader aspects of this disclosure.

Figure 4:
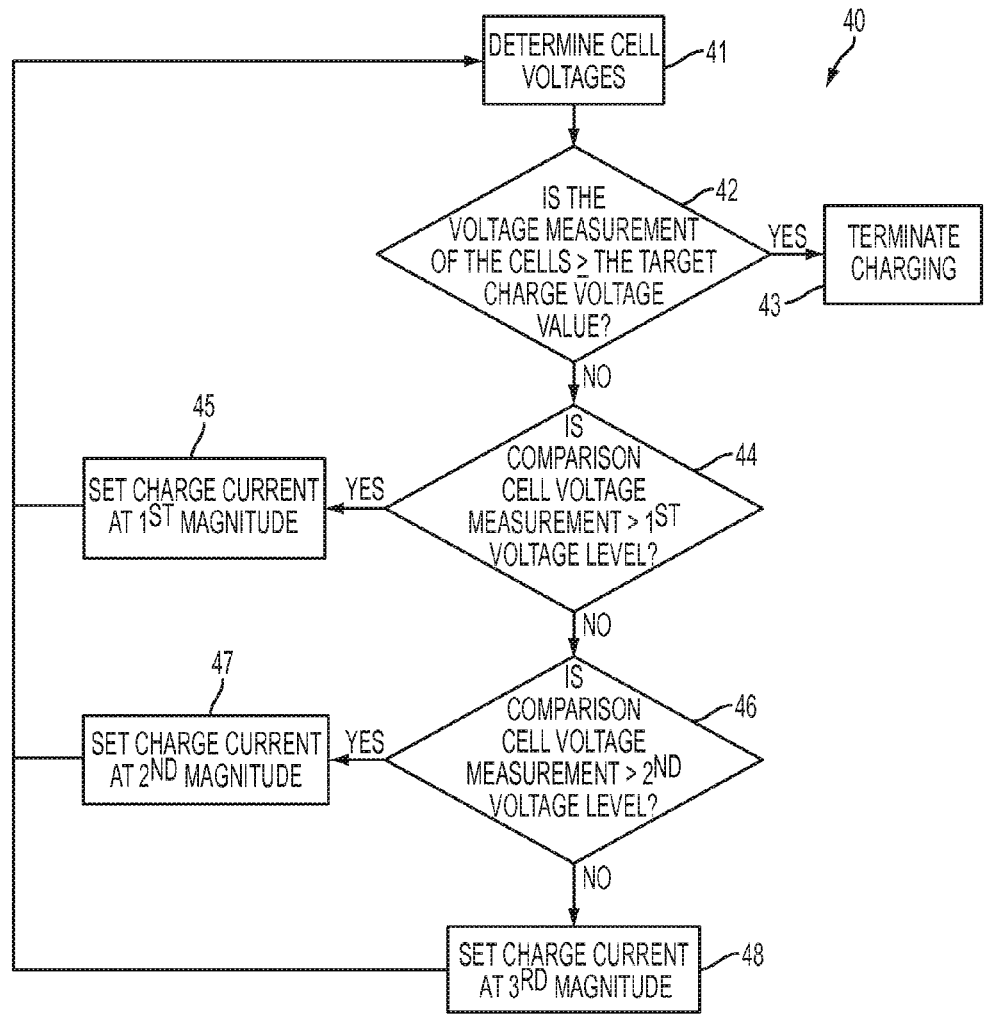
FIG. 4 is a flowchart illustrating another exemplary charging scheme according to the present disclosure.

FIG. 4 illustrates an improved charging scheme 40 which may be implemented by the charger control module 24 of the charger 18. Typically, a constant current is delivered to a battery pack regardless of the voltage of the battery cell(s) until one or more of the battery cells reach a target voltage level. In this improved scheme, the magnitude of the charging current is selected to optimize the charging of the battery pack while the voltage of the battery cells is below a target charge value. It is understood that the improved scheme described below may be applied to either of the charging schemes set forth above as well as other types of charging schemes that supply a constant current to the battery.

Various techniques for detecting the presence of the battery pack may be employed by the battery charger. Once the battery charger 18 determines that the battery pack 16 is coupled thereto, the battery charger 18 initiates the charging scheme 40. Cell voltages are continually monitored and measured throughout the charging process as indicated at step 41 by the voltage monitoring circuit 23. In an exemplary embodiment, the voltage measurements of the cell(s) can be made between charge cycles by the voltage monitoring circuit 23. The voltage measurements of the cell(s) are in turn communicated to the charging control module 24. In an alternative arrangement, the voltage measurements of the cell(s) are taken by a voltage monitoring circuit residing in the battery pack and communicated via a data link to the charging control module 24.

The voltage measurements of the cell(s) are compared to a target charge voltage value or level (e.g., a maximum cell voltage as prescribed by the cell manufacturer, i.e., 4.15 volts) at step 42. When each of the cell voltages remain below the target charge voltage value, the charger control module 24 selects a magnitude for the charge current based on the voltage measurements of the cell(s). The charger control module 24 may, for example, use (1) the voltage measurement of one of the battery cells, e.g. the cell having the largest voltage measurement or (2) the voltage measurements of a subset of cells or (3) the voltage measurements of all of the cells in the battery pack (i.e., stack voltage) for comparison to the target charge voltage value.

In an exemplary embodiment, the comparison cell voltage measurement used by the charger control module 24 is compared at step 44 to a first voltage level (e.g., 4.0 volts). If the comparison cell voltage measurement exceeds the first voltage level, then the charging control module 24 selects a first magnitude (e.g., 500 mA) for the charge current, as indicated at step 45. If the comparison cell voltage measurement is less than or equal to the first voltage level but exceeds a second voltage level (e.g., 3.8 volts), then the charging control module 24 selects a second magnitude (e.g., 2 amps) for the charge current, as indicated at step 47. If the comparison cell voltage measurement is less than the second voltage setting, then the charging control module 24 selects a third magnitude (e.g., 3 amps) for the charge current as indicated at step 48. In either case, the charger control module 24 interfaces with the power supply circuit 22 to set the charge current delivered by the power supply circuit 22 to the battery pack 16.

When at least one of the cells in the battery pack 16 reaches the target charge value, the charger control module 24 interacts with the power supply circuit 22 to discontinue delivery of a charge current to the battery pack 16 and thereby terminate the charging process as indicated at step 43. Alternatively, the charge current may be lowered by the charger control module 24 in predefined increments in the manner set forth in FIG. 3. Other schemes for continuing charging after setting the initial magnitude for the charging current are also contemplated by this disclosure.

Prior to commencing a charging of the battery pack, the charger may determine if contamination is present at the interface, (i.e., terminals) between the battery pack and the charger. It can be appreciated that the terminals of a battery pack, especially in industrial environments, can become contaminated by dirt and other unwanted debris. Contamination of the terminals can result in increased or decreased impedance at the terminals which may cause erroneous readings of battery pack voltage or cell voltages. Therefore, it is desirable to determine if contamination is present at the terminals of a battery pack coupled to a battery charger.

Figure 5:
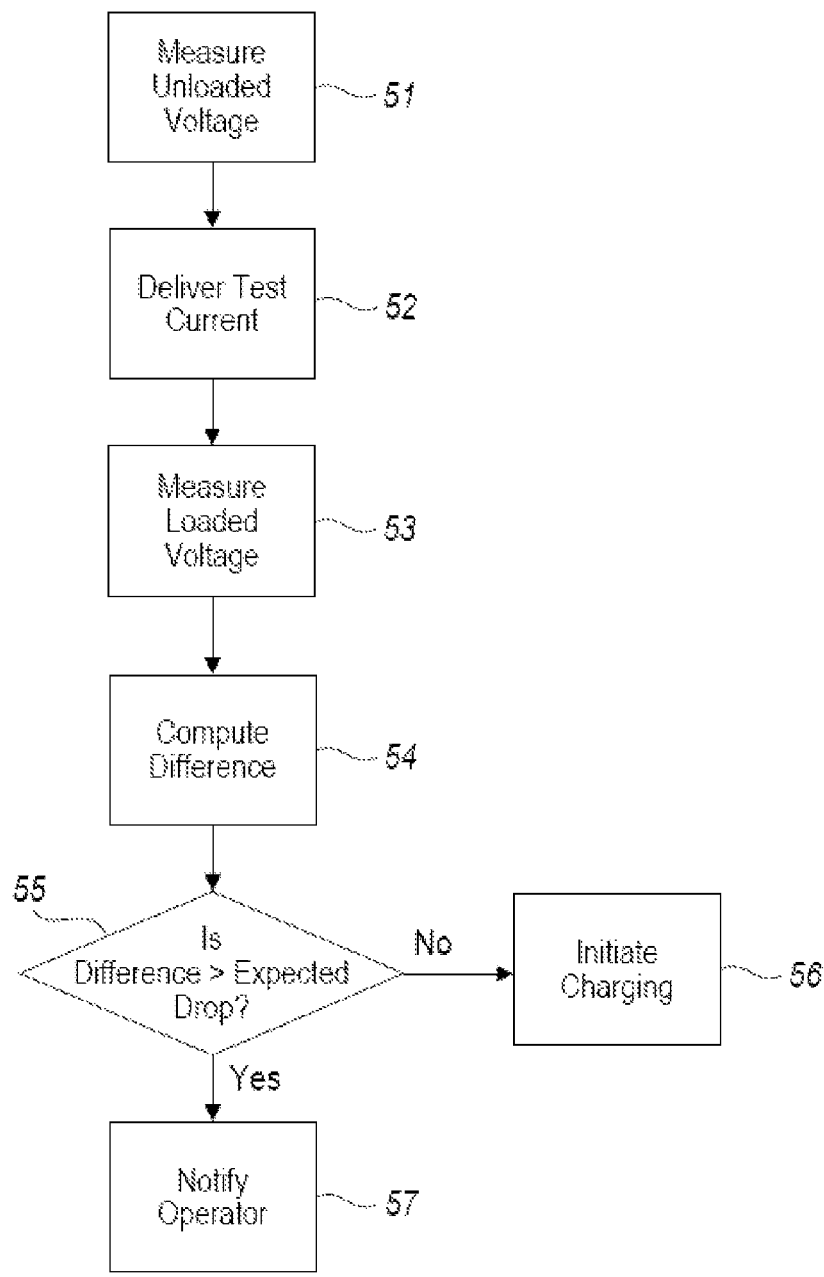
FIG. 5 is a flowchart illustrating an exemplary method for determining contamination of an interface between a battery pack and a battery charger.

Upon detecting that a battery pack is coupled to battery charger, the charger control module 24 may initiate a process for determining whether the terminals of the battery pack are contaminated as shown in FIG. 5. In an exemplary embodiment, while no current is being delivered to the battery pack, the voltage $V_U$ (i.e., an unloaded or open circuit measure) across two terminals of a battery pack is measured at step 51. More specifically, the unloaded voltage is measured at a positive battery terminal (B+) and a negative battery terminal (B−) of the battery pack. While the following description is provided with reference to voltage across these two particular terminals, it is understood that this process may be extended to other terminals on the battery pack. For instance, if the battery pack provides one or more terminals for measuring individual cell voltages (i.e., a terminal connected to a node disposed between any two of the battery cells in the pack) as shown in FIG. 2, the described voltage measurements can be taken between such a terminal and the negative battery terminal, thereby determining contamination for the terminal pair. It is understood that by comparing results from one or more terminal pairs, contamination at a single terminal may be determined by the charger control module 24.

Next, a small test current, e.g., 5-15 mA, is supplied at step 52 from the charger to the battery pack. While the current is delivered to the battery pack, the (loaded) voltage $V_L$ across the terminals of the battery pack is again measured at step 53 by the charger control module 24. It is further understood that the step of measuring the unloaded voltage does not need to be conducted prior to measuring the loaded voltage. In some embodiments, this step may be performed after the step of measuring the loaded voltage.

To determine existence of contamination, the charger control module 24 determines a difference between the loaded voltage and the unloaded voltage (difference=$V_U$−$V_L$). This difference is compared at step 55 to an expected voltage drop across the battery cells, where the expected voltage drop is derived from the known amount of current delivered to the battery pack and known impedance of the battery cells. Contamination of the terminals can be assumed when the difference exceeds for the expected voltage drop (or falls outside a variance). In some embodiment, the charger control module 24 may then initiate an action to notify the operator at step 57. For example, the operator may be notified by an audio alert, a visual alert or a vibratory alert. In response to such alerts, the operator may clean the terminals. To do so, the battery charger may have terminal wipers that clean the terminals of the pack when the battery pack is removed from the charger and/or coupled to the charger. The operator may also be given explicit instructions via a display of the charger to clean the terminals of the pack. Alternatively or additionally, the charger control module 24 may prevent further charging of the battery pack until the terminals have been decontaminated. When the difference is less than or equal to the expected voltage drop, the charger control module 24 may initiate the charging algorithm as indicated at step 56.

Figure 6:
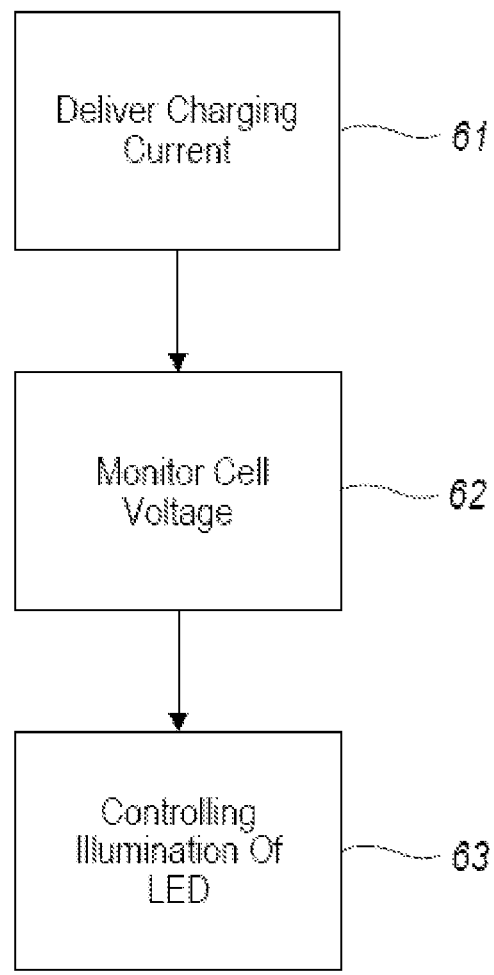
FIG. 6 is a flowchart illustrating an exemplary method for indicating state of charge of a battery being charged by a charger.

FIG. 6 illustrates an improved technique for indicating the state of charge of a battery using a single visual indicator residing on the battery charger 18. The visual indicator may alternatively be integrated into the pack. The battery charger 18 supplies a charging current to the battery pack 16 as indicated at 61. The visual indicator is in turn illuminated to indicate the state of charge of the battery as further described below. While the illumination techniques are described in relation to charging, it is contemplated that similar techniques may be employed in a battery pack to indicate the state of charge of the battery during discharge. In this case, the visual indicator may be receive a control signal from a tool operably coupled thereto or be controlled by a control module residing in the pack.

During charging, the battery charger may continually monitor and measure stack voltage and/or cell voltages throughout the charging process as indicated at 62. It is readily understood that voltage measures are indicative of state of charge of the battery. In an exemplary embodiment, cell voltage measurements can be made between charge cycles by the voltage monitoring circuit 23 of the battery charger 18. The voltage monitoring circuit 23 is preferably configured to take individual cell measurements via terminals 25 in a sequential manner during a span as further described below. The voltage measures are in turn communicated to the charging control module 24. In an alternative arrangement, the voltage measures are taken by a voltage monitoring circuit residing in the battery pack and communicated via a data link to the charging control module 24. In either case, the charger control module 24 determines the cell voltages and/or stack voltage of the battery pack.

Figure 8:
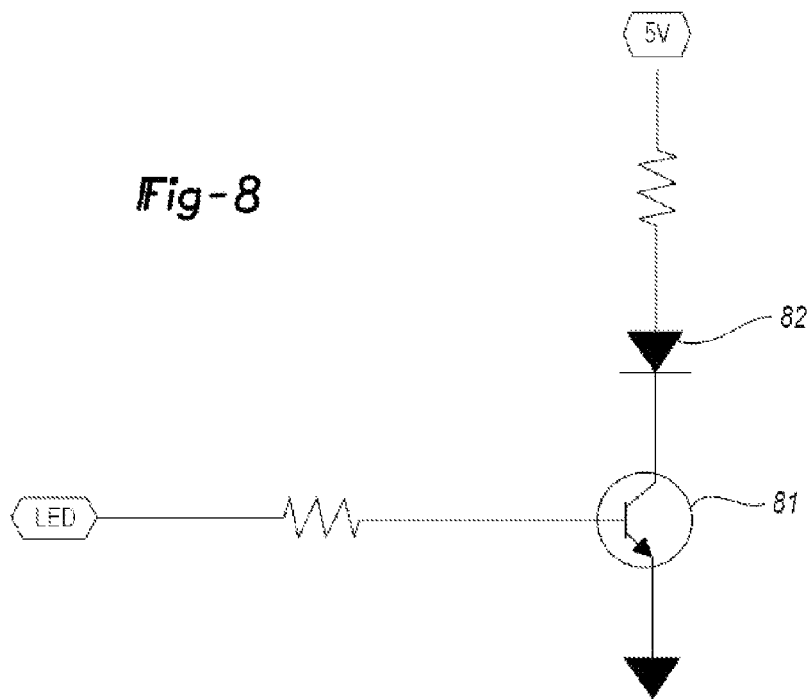
FIG. 8 is a partial schematic of a control scheme for an LED in a battery charger.

Given these voltage measures, the charge control module 24 can illuminate a visual indicator to indicate the state of charge of the battery pack. In an exemplary embodiment, the visual indicator is a single light emitting diode (LED) on the battery charger 18. With reference to FIG. 8, the LED 82 may be electrically connected in series with either a drain terminal or source terminal of a bipolar type transistor 81 although other types of transistors as well as switches are contemplated by this disclosure. By applying a control signal to the gate terminal of the transistor, the charger control module 24 can in turn control illumination of the LED. While the following description is provided with reference to a visual indicator, it is envisioned that the methods set forth below could be extended to audible indicators or other types of indicators perceptible to the operator.

In a first exemplary method, the amount of on time of the LED over a given period of time is correlated to the voltage of the battery cells being charged. For example, when the battery cells are substantially depleted, the LED is turned off (or has more off time to one time). As the battery cells are being charged, the state of charge of the battery cells increases. When the battery cells are 20% charged, the LED is lit for a proportional amount of time of a predefined time interval (e.g., 0.2 seconds of a one second time interval). When the battery cells are 60% charged, the LED is lit for 0.6 seconds of the one second time interval. In other words, the "on" time of the LED during the predefined time interval is directly proportional to the voltage of the battery cells. The time interval is repeated continuously as the battery cells are being charged. This results in a blinking light pattern where the duration of the blinking light correlates to the voltage of the battery cells. In a variant of this method, the frequency of the blinking light may be correlated to the state of charge. For example, 1 blink per second indicates the battery cells are substantially depleted (i.e., 0% state of charge); 3 blinks per second indicate the battery cells are 25% charged; and 7 blinks per second indicate 75% charged. In either case, the amount of on time can be controlled by a pulse width modulated control signal sent from the charger control module to the control terminal of the transistor 81. Other schemes for correlating amount of on time of the LED to the state of charge of the battery cells is also contemplated by this disclosure.

Figure 7:
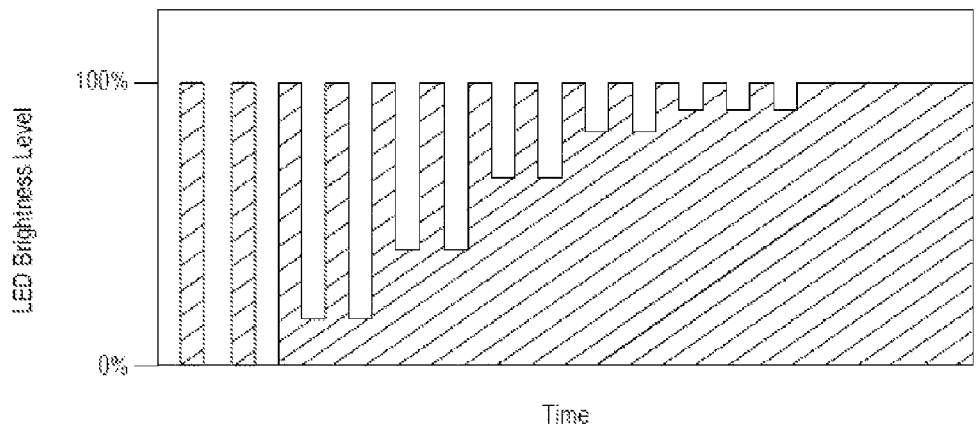
FIG. 7 is a diagram illustrating an exemplary method for illuminating a visual indicator to indicate the state of charge of the battery pack.

In a second exemplary method, the brightness of the LED is correlated to the voltage of the battery cells being charged as shown in FIG. 7. During charging, the brightness of the LED is alternated between two modes: a first mode indicates the current state of charge of a pack and a second mode serves as a reference point for when the battery cells are fully charged (i.e., LED is lit to full brightness). The charger control module 24 can drive the LED to alternate between the two illumination modes using a control signal applied of the gate terminal of the MOSFET.

When the battery cells are substantially depleted, the LED is turned off to signify the first mode. As the battery cells are being charged, the state of charge of the battery cells increases as seen in FIG. 7. To indicate the state of charge, the brightness of the LED during the first mode is made proportionate to the current voltage of the battery cells. For example, when the battery cells are 20% charged, the LED is lit to a 20% brightness level; whereas, when the battery cells are 60% charged, the LED is lit to a 60% brightness level. This may be achieved by sending a pulse width modulated control signal from the charging control module 24 to the control terminal of a transistor. That is, a control signal having a 20% duty cycle will result in an LED lit to a 20% brightness level. The LED is lit to full brightness in the second mode as shown in the figure, thereby providing the user a reference point for determining when the battery is fully charged.

In another exemplary method, a rate at which the visual indicator is illuminated correlates to the voltage of the battery cells. In other words, an LED that glows brighter slowly would equate to a lower state of charge than an LED that glows brighter more quickly. Likewise, the illumination of the LED is controlled by the control signal sent to the control terminal of the transistor by the charger control module 24. Two or more of these approaches may also be combined. For example, both the on time of the LED and the rate of brightness change may be correlated to the state of charge of the battery cells. It is further envisioned that these method may be extended to a visual indicator that illuminates two colors (e.g., green and red). Such indicators having two embedded diodes are emerging in the marketplace. During charging, the indicator is illuminated red in accordance with one of the method described above but could be charged to green to indicate the pack is fully charged.

Figure 9:
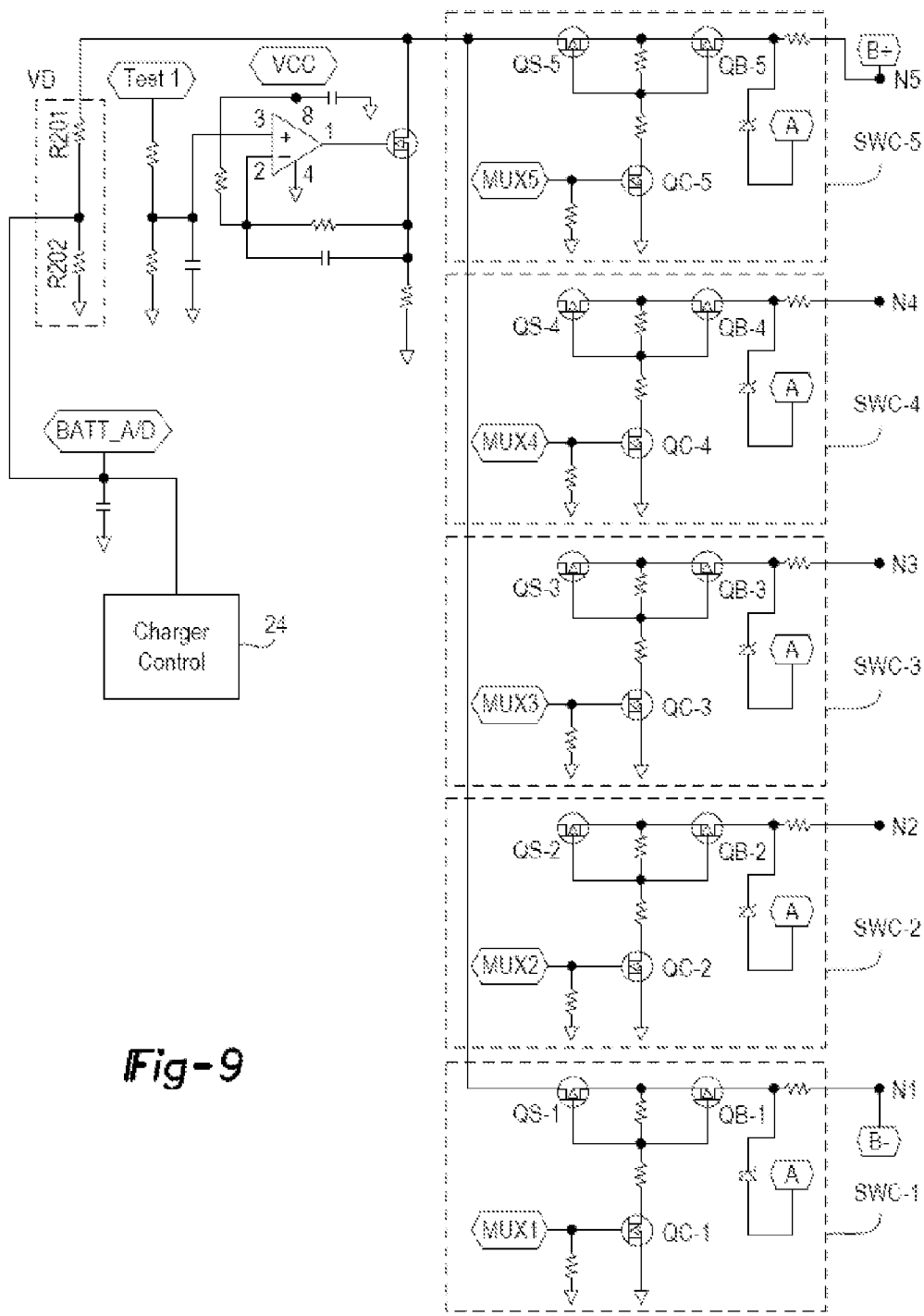
FIG. 9 is a schematic of an exemplary voltage monitoring circuit that may be employs in a battery charger.

FIG. 9 is a schematic of an exemplary voltage monitoring circuit 23 which may be employed by the battery charger 18. The voltage monitoring circuit is generally comprised of a single voltage divider VD interposed between the charger control module 24 and a plurality of switching sub-circuits SWC-1 thru SWC-5. Of note, the voltage divider VD includes two precision resistors R201 and R202. In this context, the precision resistors have a tolerance on the order of 0.1% or better, thereby reducing the measurement error reported to the charger control module 24. Since the cost associated with such precision resistors can be burdensome in some applications, multiplexing a single voltage divider VD amongst a plurality of measurement nodes lowers the cost for implementing the voltage monitoring circuit 23.

The plurality of switching sub-circuits SWC are interposed between the voltage divider VD and a plurality of cell measurement nodes. Each switching sub-circuit SWC is constructed primarily using three switching elements (e.g. MOSFETs): a conducting switch QS-n, a blocking switch QB-n and a control switch QC-n. In the exemplary case of MOSFETs, the conducting switch QS-n and the blocking switch QB-n are coupled in series, such that the conducting switch QS-n performs the primary switching function and the blocking switch QB-n acts as a diode to prevent current flow when the accompanying conducting switch is in a non-conducting state. In the exemplary embodiment, the control terminal for each of the conducting switch QS-n and the blocking switch QB-n are coupled to the drain terminal of the control switch QC-n. In this way, the control switch QC-n controls the conductive state of the other two switching elements. The control terminal of the control switch QC-n is in turn coupled to and controlled by the charger control module 24. Note that the op amp in this circuit arrangement is also controlled by the charger control module 24 to supply the test current used in the contamination detection scheme described above. It is readily understood that other types of switching elements and other circuit components may be used to the switching sub-circuits. Likewise, other circuit arrangements may be used to implement this described functionality.

During operation, the charging control module 24 turns on a control switch QC-n from one of the switching sub-circuits, thereby placing the other two switching elements in a conductive state and presenting a voltage measure from the corresponding cell measurement node to the charger control module 24. To determine the cell voltage for each battery cell, the charger control module 24 selects sequentially a different switching sub-circuit. For example, the charger control module 24 may begin by turning on the control switch CQ-1 from switching sub-circuit SWC-1. The voltage measure from cell measurement node N1 corresponds to cell voltage for cell one. Next, the charger control module 24 will turn off control switch QC-1 and turn on control switch QC-2, thereby presenting the voltage measure from cell measurement node N2 to the charger control module 24. Cell voltage for cell two can be determined by subtracting the voltage measure from cell measurement node N1 from the voltage measure from cell measurement node N2. The charger control module 24 can repeat this process for each of the remaining switching sub-circuits in order to determine a cell voltage for each cell. It is noted that when the measurement from any two nodes is subtracted from each other, any common error is eliminated, thereby further improving measurement accuracy.

The exemplary voltage monitoring circuit 23 has been described in the context of a battery charger. It is readily understood that the voltage monitoring circuit could also be incorporated in to a battery pack. In this arrangement, the control module in the pack would monitor and measure cell voltages, e.g., during charging or discharging. During charging, the individual cell voltages could then be communicated via a data link to the battery charger. The battery charger could in turn control charging in the manner set forth above.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of charging a battery pack coupled to a battery charger comprising:

determining a voltage of a plurality of battery cells in the battery pack;

selecting a charge current from amongst two or more different charge currents based on the determined voltage of the plurality of battery cells when the determined voltage of the plurality of battery cells is below a target charge value; and delivering the selected charge current to the plurality of battery cells.

2. The method of claim 1 wherein determining the voltage of the plurality of battery cells further comprises receiving voltage measurements via a data link between the battery pack and the battery charger.

3. The method of claim 1 wherein determining the voltage of the plurality of further comprises measuring a voltage of the plurality of battery cells across terminals coupling the battery pack to the battery charger.

4. The method of claim 1 further comprising comparing the determined voltage of the plurality of battery cells to a voltage setting; and wherein selecting the charge current further comprises selecting a first magnitude for the charge current when the determined voltage exceeds the voltage setting and selecting a second magnitude for the charge current when the determined voltage is less than the voltage setting, the first magnitude being lower than the second magnitude.

5. The method of claim 1 further comprising delivering the selected charge current to the plurality of battery cells during periodic charge cycles; determining the voltage of the plurality of battery cells in the battery pack after each charge cycle; and selecting a magnitude for the charge current in an upcoming charge cycle based on the voltage of the plurality of battery cells determined after a preceding charge cycle.

6. The method of claim 1 further comprising monitoring a cell voltage of each cell in the plurality of battery cells to determine when the cell voltage of at least one of the cells reaches the target charging value; and discontinuing delivering charge current when the cell voltage of at least one of the cells reaches the target charging value.

7. The method of claim 6 wherein the measuring of the cell voltage of each cell in the plurality of battery cells occurs at one more terminals of the battery pack where a given terminal is connected to a node disposed between two of the battery cells in the battery pack.

* * * * *